(12) United States Patent
Kawaguchi et al.

(10) Patent No.: US 11,549,974 B2
(45) Date of Patent: Jan. 10, 2023

(54) CURRENT SENSOR

(71) Applicant: Yazaki Corporation, Tokyo (JP)

(72) Inventors: Yasunori Kawaguchi, Shizuoka (JP); Yoshiyuki Mizuno, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 42 days.

(21) Appl. No.: 17/227,247

(22) Filed: Apr. 9, 2021

(65) Prior Publication Data
US 2021/0318364 A1    Oct. 14, 2021

(30) Foreign Application Priority Data

Apr. 13, 2020  (JP) .............................. JP2020-071436

(51) Int. Cl.
| | | |
|---|---|---|
| *G01R 19/32* | (2006.01) | |
| *G01R 31/382* | (2019.01) | |
| *G01R 15/14* | (2006.01) | |
| *G01R 31/364* | (2019.01) | |
| *G01R 1/20* | (2006.01) | |

(52) U.S. Cl.
CPC ............. *G01R 19/32* (2013.01); *G01R 1/203* (2013.01); *G01R 15/146* (2013.01); *G01R 31/364* (2019.01); *G01R 31/382* (2019.01)

(58) Field of Classification Search
CPC ...... G01R 19/32; G01R 1/203; G01R 15/146; G01R 31/364; G01R 31/382; G01R 1/44; G01R 31/374; G01R 19/0092; G01R 15/00; G01R 31/385; G01R 31/3624; G01R 31/3696; G01R 15/20; G01R 31/3842

USPC .................................................. 324/426, 126
See application file for complete search history.

(56) References Cited

U.S. PATENT DOCUMENTS

| | | | | |
|---|---|---|---|---|
| 2008/0030208 A1* | 2/2008 | Aratani | ............... | H01M 10/425 324/713 |
| 2015/0108965 A1* | 4/2015 | Sato | ....................... | G01R 1/203 324/120 |
| 2016/0124023 A1* | 5/2016 | Sato | ..................... | G01R 31/364 324/126 |
| 2016/0141731 A1* | 5/2016 | Tanigawa | ............. | G01R 31/364 324/437 |
| 2018/0180681 A1* | 6/2018 | Tanaka | ................ | H01M 50/562 |

(Continued)

FOREIGN PATENT DOCUMENTS

| | | |
|---|---|---|
| JP | 4127641 B2 | 7/2008 |
| JP | 2015-25694 A | 2/2015 |

(Continued)

*Primary Examiner* — Tung X Nguyen
*Assistant Examiner* — Robert P Alejnikov, Jr.
(74) *Attorney, Agent, or Firm* — Kenealy Vaidya LLP

(57) ABSTRACT

A current sensor includes a battery terminal portion that is conductive and is fastened to a battery post; a shunt resistor for current detection, which is formed in a plate shape and is electrically connected to the battery terminal portion; and a circuit board that is formed in a plate shape and is electrically connected to the shunt resistor, in which the shunt resistor is erected on a main surface of the circuit board. With this configuration, since the shunt resistor and the circuit board can be arranged so as not to face each other and not confront each other, the influence of heat generated by the shunt resistor can be suppressed.

10 Claims, 13 Drawing Sheets

(56) References Cited

U.S. PATENT DOCUMENTS

2020/0025802 A1* 1/2020 Endo .................. H01C 1/14
2020/0064380 A1* 2/2020 Li ..................... G01R 15/207

FOREIGN PATENT DOCUMENTS

| JP | 2015-215167 A | 12/2015 |
| JP | 2019-211464 A | 12/2019 |

* cited by examiner

CURRENT SENSOR

CROSS-REFERENCE TO RELATED APPLICATION(S)

The present application claims priority to and incorporates by reference the entire contents of Japanese Patent Application No. 2020-071436 filed in Japan on Apr. 13, 2020.

BACKGROUND OF THE INVENTION

1. Field of the Invention

The present invention relates to a current sensor.

2. Description of the Related Art

As a technique relating to a conventional current sensor, for example, Japanese Patent Application Laid-open No. 2019-211464 discloses a current sensor including a housing with a bus bar and a shunt resistor. The housing with the bus bar has a housing, a first bus bar, and a second bus bar. The housing is formed of an insulating resin material. The first bus bar is inserted so as to be partially embedded in the housing and is attached to a battery post. The second bus bar is inserted so as to be partially embedded in the housing in a state of being separated from the first bus bar, and is connected to a wire harness. The shunt resistor electrically connects the first bus bar and the second bus bar.

By the way, the current sensor described in Japanese Patent Application Laid-open No. 2019-211464 described above has room for further improvement in, for example, suppressing an influence of heat generated by the shunt resistor.

SUMMARY OF THE INVENTION

The present invention has been made in view of the above circumstances, and an object of the present invention is to provide a current sensor capable of suppressing the influence of heat generated by a shunt resistor.

In order to achieve the above mentioned object, a current sensor according to one aspect of the present invention includes a battery terminal portion that is conductive and is fastened to a battery post; a shunt resistor for current detection, which is formed in a plate shape and is electrically connected to the battery terminal portion; and a circuit board that is formed in a plate shape and is electrically connected to the shunt resistor, wherein the shunt resistor is erected on a main surface of the circuit board.

According to another aspect of the present invention, in the current sensor, it is possible to configure that the shunt resistor extends along a normal direction of the main surface of the circuit board.

According to still another aspect of the present invention, in the current sensor, it is possible to configure that the shunt resistor intersects the main surface of the circuit board perpendicularly.

In order to achieve the above mentioned object, a current sensor according to still another aspect of the present invention includes a battery terminal portion that is conductive and is fastened to a battery post; a shunt resistor for current detection, which is formed in a plate shape and is electrically connected to the battery terminal portion; and a circuit board that is formed in a plate shape and is electrically connected to the shunt resistor, wherein the shunt resistor intersects a main surface of the circuit board perpendicularly.

According to still another aspect of the present invention, in the current sensor, it is possible to further include a housing that has an insulating property and embeds the shunt resistor and the circuit board, wherein the housing has a lightening portion formed in a concave shape.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, an embodiment according to the present invention will be described in detail with reference to the drawings. Note that the present invention is not limited by this embodiment. In addition, components in the following embodiment include those that can be easily replaced by those skilled in the art or those that are substantially the same.

Note that in the following description, among the first direction, the second direction, and the third direction that intersect each other, the first direction is referred to as "axis direction X", the second direction is referred to as "first width direction Y", and the third direction is referred to as "second width direction Z". Here, the axis direction X, the first width direction Y, and the second width direction Z are substantially orthogonal to each other. The axis direction X typically corresponds to a direction along a central axis C (see FIG. 2 and the like) of a battery post in which the current sensor is provided, a height direction of a battery, a normal direction along a normal N (see FIG. 6) of a circuit board, and the like. The first width direction Y typically corresponds to the direction in which a battery terminal portion and a sensor unit are aligned, a short side direction of the battery, and the like. The second width direction Z typically corresponds to a tightening direction of the battery terminal portion, a long side direction of the battery, and the like. Typically, with the current sensor installed in the vehicle and the vehicle located in the horizontal plane, the axis direction X is along a vertical direction, and the first width direction Y and the second width direction Z are along a horizontal direction. Respective directions used in the following description refer to directions in a state where respective portions are assembled to each other unless otherwise specified.

EMBODIMENT

Figure 1:
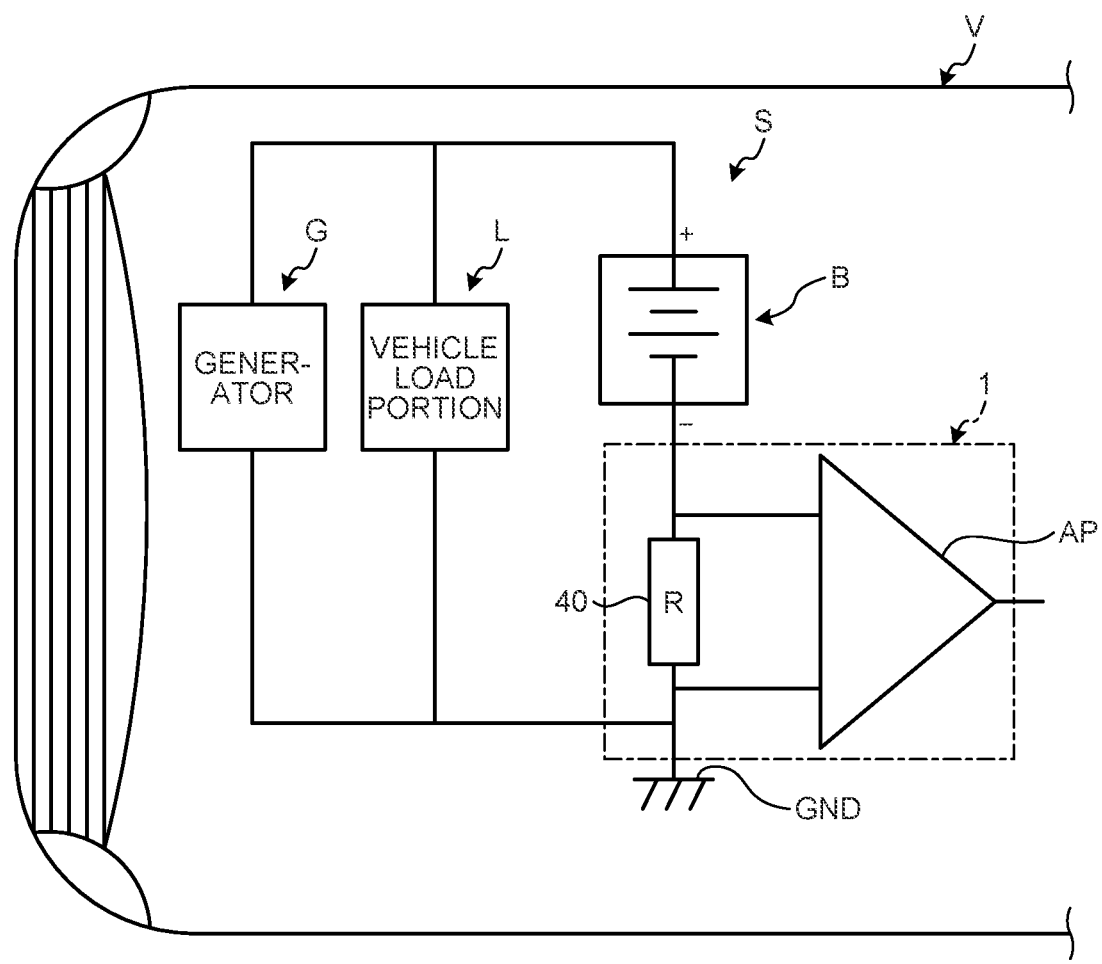
FIG. 1 is a circuit diagram illustrating a schematic configuration of a current sensor according to an embodiment.
Figure 2:
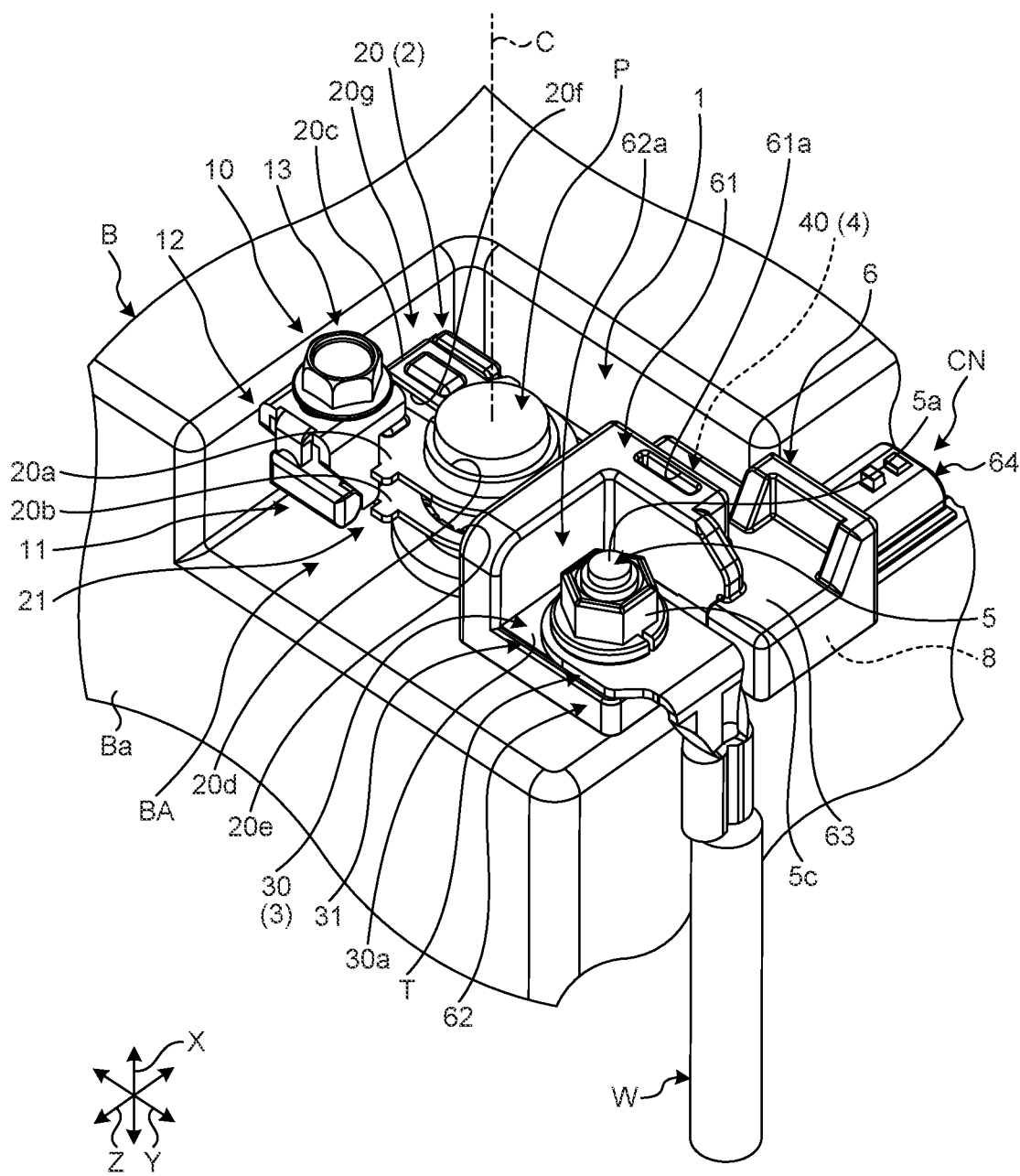
FIG. 2 is a perspective view illustrating a schematic configuration of the current sensor according to the embodiment.
Figure 3:
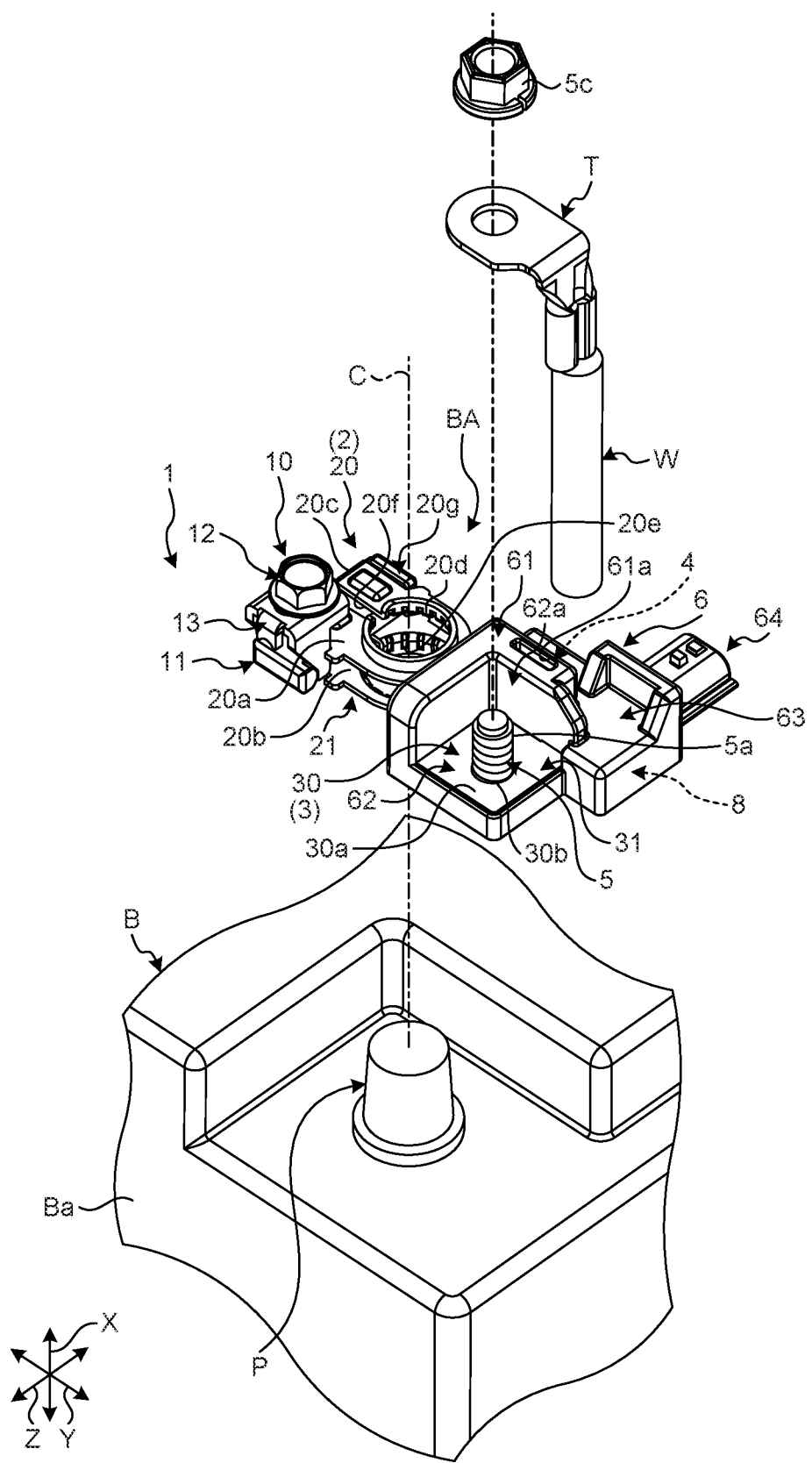
FIG. 3 is an exploded perspective view illustrating a schematic configuration of the current sensor according to the embodiment.
Figure 4:
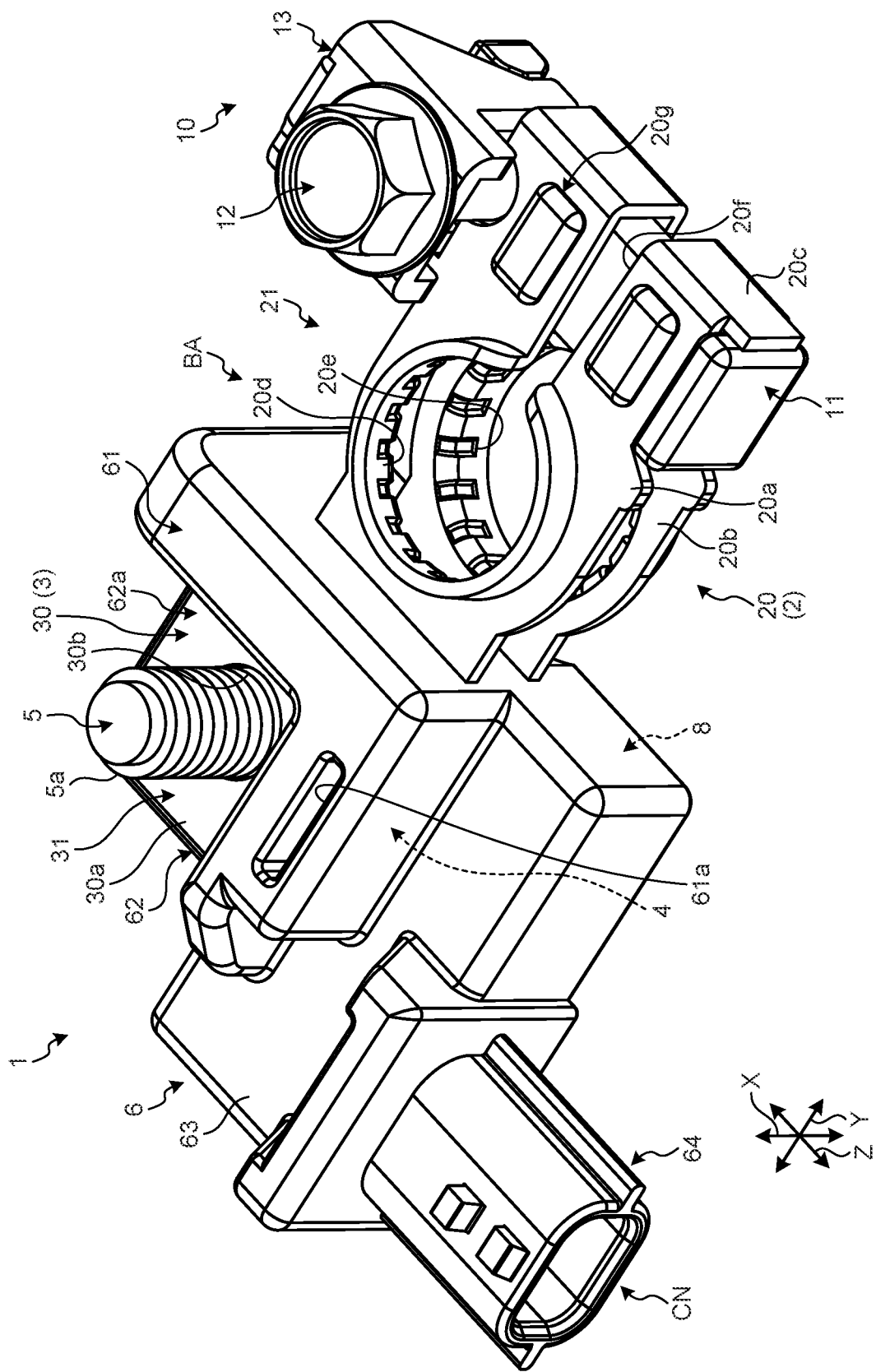
FIG. 4 is a perspective view illustrating a schematic configuration of the current sensor according to the embodiment.

A current sensor 1 of the present embodiment illustrated in FIGS. 1, 2, and 3 is a sensor for measuring a charge/discharge current of a battery B mounted on a vehicle V. In a power supply system S of the vehicle V including the battery B, in recent years, the consumption of the battery B tends to increase relatively with an increase in the types, numbers, and the like of electrical components of the vehicle V, and in order to deal with such a tendency, there is a request to monitor a state of the battery B more appropriately. In order to respond to such a request, the power supply system S detects the charge/discharge current of the battery B by the current sensor 1, and monitors the remaining capacity of the battery B, detects the consumption (deterioration degree) of the battery B, performs fuel consumption improvement processing by controlling an operation of a generator G such as an alternator, and the like based on the detected current (current value).

The current sensor 1 of the present embodiment is configured to have a battery mounting structure, and here, a battery terminal integrated sensor integrated with a battery terminal (battery terminal portion 2) is configured. Here, the battery B is mounted on the vehicle V as a power storage device. In the battery B, a battery post P is erected in a battery housing Ba that houses a battery fluid and various components. The battery post P is a lead electrode and is erected on one surface of the battery housing Ba, typically on a surface located on an upper side in a vertical direction with the battery B mounted on the vehicle V. The battery post P projects from the surface of the upper side in the vertical direction of the battery housing Ba toward the upper side in the vertical direction. The battery post P is formed in a columnar shape, more specifically, a columnar shape tapered so that a diameter decreases toward a tip side. The battery post P is arranged so that the central axis C is in the vertical direction, here along the axis direction X, and extends in a columnar shape along the axis direction X. A total of two battery posts P are provided in one battery B, one as a positive electrode (plus (+) electrode) and one as a negative electrode (minus (−) electrode) (only one side is illustrated in FIGS. 2, 3, etc.).

The current sensor 1 constituting the battery terminal integrated sensor is fastened to the battery post P configured as described above. The current sensor 1 of the present embodiment is provided in the battery post P on the negative electrode side of the battery B, and is interposed between the battery B and the generator G, a vehicle load portion L, a ground portion (vehicle body, etc.) GND, and the like, and detects the current flowing between the battery post P and these components. Here, the current sensor 1 is fastened to the battery post P on the negative electrode side and electrically connected to the battery post P, and is electrically connected to a connection terminal T provided at an end of an electric wire (for example, a ground wire) W on the ground portion GND side. Then, the current sensor 1 is interposed between the connection terminal T and the battery post P, electrically connects them to each other, and then detects the current flowing between the connection terminal T and the battery post P.

Figure 5:
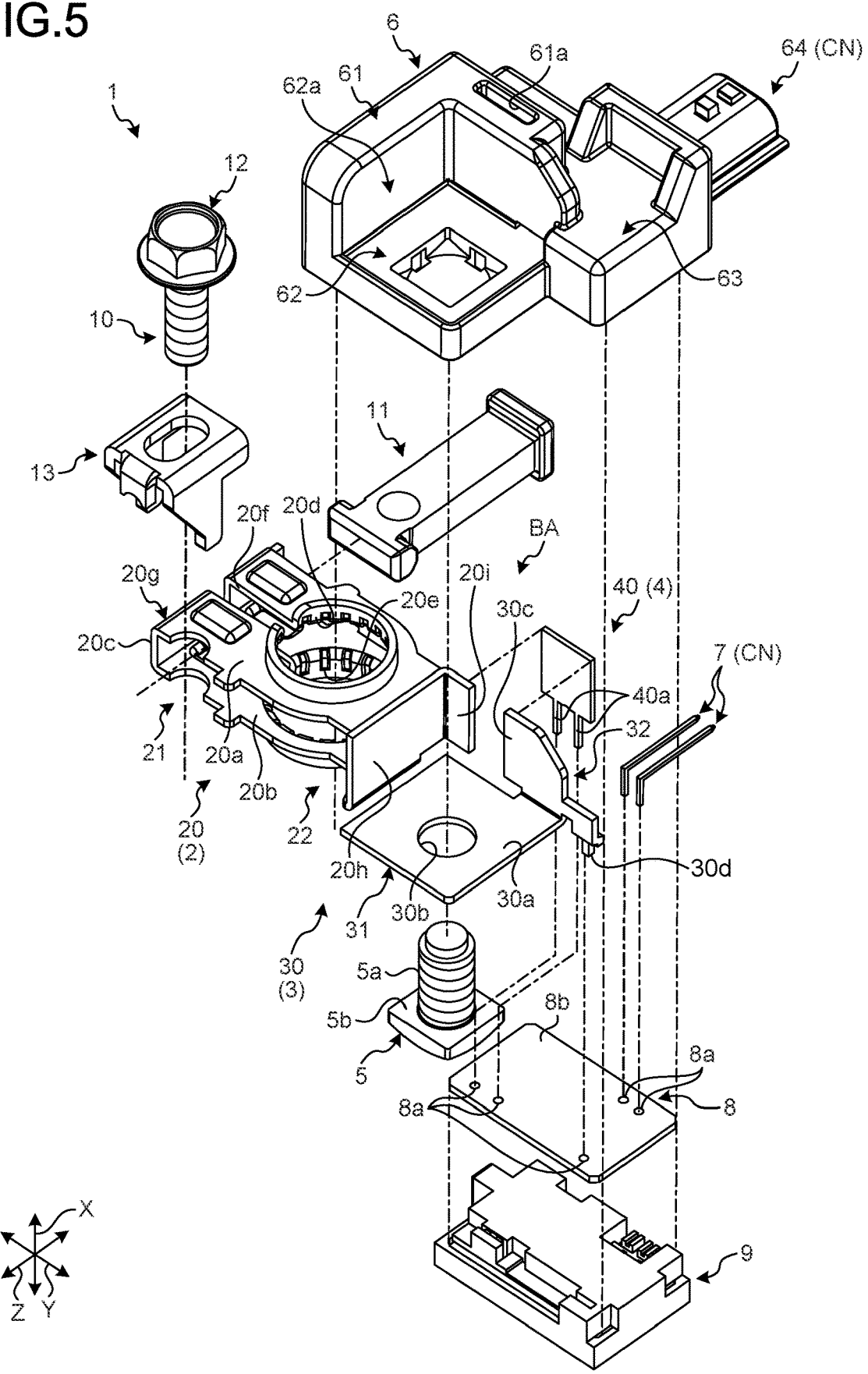
FIG. 5 is an exploded perspective view illustrating a schematic configuration of the current sensor according to the embodiment.

The current sensor 1 of the present embodiment is a so-called shunt type current sensor. That is, the current sensor 1 passes a current through a shunt resistor 40 (see also FIG. 5 and the like), and measures a current value from a voltage drop when energized and a resistance value of the shunt resistor 40 using Ohm's law. The current sensor 1 typically amplifies and outputs a voltage (detection voltage) generated across the shunt resistor 40 according to the current flowing through the shunt resistor 40 by an amplifier AP, and detects the current flowing through the shunt resistor 40 based on the output of the amplifier AP. For example, compared with a magnetic detection type current sensor using so-called Hall IC etc., the shunt type current sensor 1 has advantages that a selection range of electronic components is wide and it is possible to flexibly response to higher accuracy and lower price, temperature characteristics are good by using an alloy with little temperature change as the shunt resistor 40, it is less affected by external magnetic field, a core/shield plate or the like is not required and the weight is light, and the like.

Then, the current sensor 1 of the present embodiment has a layout in which each portion is laid out in consideration of heat dissipation against the heat generated by the shunt resistor 40 when detecting the current to realize a configuration in which the influence of heat generated by the shunt resistor 40 is reduced. Hereinafter, each configuration of the current sensor 1 will be described in detail with reference to each figure.

Specifically, as illustrated in FIGS. 2, 3, 4, 5, and 6, the current sensor 1 includes a battery terminal portion 2, a terminal connection portion 3, a sensor unit 4, a stud bolt 5, a housing 6, an output terminal 7, a circuit board 8, a mold material 9, and a tightening mechanism 10. In the following, each portion of the current sensor 1 will be described mainly with reference to FIGS. 2, 3, 4, 5, and 6, as appropriate, with reference to FIGS. 7, 8, and 9.

The battery terminal portion 2, the terminal connection portion 3, and the sensor unit 4 are integrated to form a bus bar assembly BA. In other words, it can be said that the current sensor 1 includes the bus bar assembly BA. The bus bar assembly BA includes a BT bus bar 20, a GND bus bar 30, and the shunt resistor 40, and these are integrally configured. The BT bus bar 20 is a first bus bar that constitutes the battery terminal portion 2. The GND bus bar 30 is a second bus bar that constitutes the terminal connection portion 3. The shunt resistor 40 is a resistor for current detection that is electrically connected to the BT bus bar 20 and the GND bus bar 30 and constitutes the sensor unit 4.

The BT bus bar 20, the GND bus bar 30, and the shunt resistor 40 are plate-shaped metal conductors having conductivity. The BT bus bar 20, the GND bus bar 30, and the shunt resistor 40 are subjected to various processing to be formed into shapes corresponding to the battery terminal portion 2, the terminal connection portion 3, and the sensor unit 4, respectively. The BT bus bar 20 and the GND bus bar 30 are made of a metal having good conductivity, for example, copper (Cu) or a copper alloy. On the other hand, the shunt resistor 40 is made of a dissimilar metal different from the BT bus bar 20 and the GND bus bar 30, for example, copper/manganese/nickel (Cu—Mn—Ni)-based alloys, copper/nickel (Cu—Ni)-based alloys, nickel-chromium (Ni—Cr)-based alloys, and the like with good temperature characteristics, whose resistance value does not easily fluctuate according to temperature.

The battery terminal portion 2 is a portion that has conductivity and is fastened to the battery post P, and is configured by the above-mentioned BT bus bar 20. The battery terminal portion 2 includes a main body portion 21 and an electrode portion 22. In the battery terminal portion 2, for example, the main body portion 21 and the electrode portion 22 are integrally formed by subjecting the BT bus bar 20 to press bending or the like.

The main body portion 21 is a main portion to be fastened to the battery post P. The main body portion 21 includes a pair of plate-shaped portions 20a and 20b, and a bending connection portion 20c. The pair of plate-shaped portions 20a and 20b are formed in a substantially rectangular annular shape and a plate shape, each having various uneven shapes and notch shapes. The plate-shaped portions 20a and 20b have a plate thickness direction extending along the axis direction X, and along the first width direction Y and the second width direction Z. The pair of plate-shaped portions 20a and 20b are located so as to face each other along the axis direction X in a state of being spaced along the axis direction X. In the main body portion 21, the plate-shaped portion 20a is located on the upper side in the vertical direction (opposite to the installation surface of the battery post P) in the state of being fastened to the battery post P, and the plate-shaped portion 20b is located on the lower side in the vertical direction (the installation surface side of the battery post P). The plate-shaped portion 20a and the plate-shaped portion 20b are integrally formed so that the ends on one side of the first width direction Y (the side opposite to the electrode portion 22 side) are continuous via the bending connection portion 20c. As a result, the main body portion 21 is formed in a state of being folded back in a substantially U shape as a whole with the bending connection portion 20c sandwiched therein, and the plate-shaped portion 20a and the plate-shaped portion 20b face each other in the axis direction X, and are stacked in a plate shape substantially parallel to each other in the vertical direction.

The pair of plate-shaped portions 20a and 20b are formed in a substantially rectangular annular shape as described above by forming post insertion holes 20d and 20e, respectively. The post insertion holes 20d and 20e are holes into which the battery post P is inserted, and penetrate through the plate-shaped portions 20a and 20b along the axis direction X, respectively. The post insertion holes 20d and 20e are formed in a substantially circular shape according to an outer diameter shape of the battery post P. The post insertion hole 20d and the post insertion hole 20e are formed in a positional relationship in which the pair of plate-shaped portions 20a and 20b face each other along the axis direction X in a state of being stacked vertically via the bending connection portion 20c. The post insertion holes 20d and 20e have a taper corresponding to the taper of the battery post P formed on each inner peripheral wall surface, and each inner peripheral wall surface comes into contact with the battery post P with the battery post P inserted.

Then, in the main body portion 21, a slit (gap) 20f is formed over the pair of plate-shaped portions 20a and 20b and the bending connection portion 20c. The slit 20f extends along the first width direction Y at the end of the pair of plate-shaped portions 20a and 20b on the bending connection portion 20c side and is continuous with the post insertion holes 20d and 20e, and extends along the axis direction X at the bending connection portion 20c. In other words, the slit 20f is formed to extend from the post insertion holes 20d and 20e to the bending connection portion 20c so as to divide a part of the plate-shaped portions 20a and 20b. In the main body portion 21, the portion where the slit 20f is formed at the end of the pair of plate-shaped portions 20a and 20b on the bending connection portion 20c side constitutes a tightening end portion 20g. The tightening end portion 20g is a portion that is tightened by the tightening mechanism 10 when the battery terminal portion 2 is fastened to the battery post P.

The electrode portion 22 is located side by side with the main body portion 21 along the first width direction Y, and is a portion to which the shunt resistor 40 is joined. The electrode portion 22 is one of the pair of plate-shaped portions 20a and 20b, and here, the electrode portion 22 is integrally and electrically connected with the plate-shaped portion 20b (see FIG. 7). The electrode portion 22 includes an extension portion 20h and a joint piece portion 20i. The extension portion 20h is formed in a plate shape so as to be folded back along the axis direction X from an end portion 20ba (see FIG. 7) of the plate-shaped portion 20b in the first width direction Y. The extension portion 20h extends in the plate thickness direction along the first width direction Y, along the axis direction X, and along the second width direction Z. The extension portion 20h is formed by being bent substantially perpendicularly to one side along the axis direction X from the end portion 20ba of the plate-shaped portion 20b. The extension portion 20h extends from the end portion 20ba of the plate-shaped portion 20b toward the plate-shaped portion 20a along the axis direction X, and is positioned at a distance from an end surface of an end portion 20aa of the plate-shaped portion 20a. The joint piece portion 20i is formed in a plate shape so as to be folded back along the first width direction Y from an end portion of one side of the extension portion 20h in the second width direction Z. The joint piece portion 20i has a plate thickness direction extending along the second width direction Z, along the axis direction X, and along the first width direction Y. The joint piece portion 20i is formed by being bent substantially perpendicularly from the end portion of the extension portion 20h to the side opposite to the main body portion 21 side along the first width direction Y.

The terminal connection portion 3 has conductivity and is a portion to which the connection terminal T of the electric wire W is electrically connected, and is configured by the above-mentioned GND bus bar 30. The terminal connection portion 3 is located side by side with the battery terminal portion 2 at intervals along the first width direction Y, and includes a fastening portion 31 and an electrode portion 32. In the terminal connection portion 3, for example, the fastening portion 31 and the electrode portion 32 are integrally formed by subjecting the GND bus bar 30 to press bending or the like.

The fastening portion 31 is a portion where the connection terminal T is fastened and electrically connected. The fastening portion 31 includes a plate-shaped portion 30a. The plate-shaped portion 30a is formed in a substantially rectangular plate shape, and is electrically connected to the ground portion GND or the like via the stud bolt 5, the connection terminal T, the electric wire W, or the like to be grounded. The plate-shaped portion 30a has a plate thickness direction extending along the axis direction X, and along the first width direction Y and the second width direction Z. A bolt insertion hole 30b is formed in the plate-shaped portion 30a. The bolt insertion hole 30b is a hole into which a shaft portion 5a of the stud bolt 5 is inserted, and penetrates through the plate-shaped portion 30a along the axis direction X.

Here, the stud bolt 5 is a fastening member that fastens the fastening portion 31 of the terminal connection portion 3 and the connection terminal T to electrically connect the fastening portion 31 and the connection terminal T. The stud bolt 5 is formed so that the shaft portion 5a protrudes from a base portion 5b. The stud bolt 5 fastens the fastening portion 31 of the terminal connection portion 3 and the connection terminal T to make a conductive connection by screwing a nut 5c into the shaft portion 5a in a state where the shaft portion 5a is inserted into the bolt insertion hole 30b and the connection terminal T is assembled.

The electrode portion 32 is located side by side with the electrode portion 22 of the battery terminal portion 2 at intervals along the first width direction Y, and is a portion to which the shunt resistor 40 is joined. The electrode portion 32 is integrated with the plate-shaped portion 30a and is electrically connected. The electrode portion 32 includes a joint piece portion 30c and a ground terminal portion 30d. The joint piece portion 30c is formed in a plate shape so as to be folded back along the axis direction X from an end portion of one side of the plate-shaped portion 30a in the second width direction Z. The joint piece portion 30c has a plate thickness direction extending along the second width direction Z, along the axis direction X, and along the first width direction Y. The joint piece portion 30c is formed by being bent substantially perpendicularly from the end portion of the plate-shaped portion 30a to one side (the same side as the extension portion 20h of the electrode portion 22) along the axis direction X. The ground terminal portion 30d extends from the joint piece portion 30c to one side in the first width direction Y, and is formed by being bent toward the plate-shaped portion 30a along the axis direction X. The bent end portion of the ground terminal portion 30d is formed in a tab shape along the axis direction X. The ground terminal portion 30d is electrically connected to the circuit board 8 to electrically connect and ground the circuit board 8 to the ground portion GND or the like via the joint piece portion 30c, the plate-shaped portion 30a, the stud bolt 5, the connection terminal T, the electric wire W, and the like.

The sensor unit 4 is a portion that is located side by side with the battery terminal portion 2 along the first width direction Y, is electrically connected to the battery terminal portion 2, and detects a current. Here, the sensor unit 4 is located between the battery terminal portion 2 and the terminal connection portion 3 along the first width direction Y. The sensor unit 4 of the present embodiment constitutes a shunt type sensor unit, and includes the above-mentioned shunt resistor 40.

The shunt resistor 40 is formed in a plate shape, and is electrically connected to one of the pair of plate-shaped portions 20a and 20b of the battery terminal portion 2, here, the plate-shaped portion 20b via the electrode portion 22.

The shunt resistor 40 is located between the joint piece portion 20i and joint piece portion 30c in a state in which the end surface of the joint piece portion 20i of the electrode portion 22 of the battery terminal portion 2 and the end surface of the joint piece portion 30c of the electrode portion 32 of the terminal connection portion 3 face each other along the first width direction Y. Then, the shunt resistor 40 is joined to the joint piece portion 20i and the joint piece portion 30c. In such a sensor unit 4, the joint piece portion 20i of the battery terminal portion 2 serves as an electrode (the electrode on the negative electrode side of the battery B) on one side to which the shunt resistor 40 is joined, and the joint piece portion 30c of the terminal connection portion 3 serves as an electrode (the electrode on the ground portion GND side) on the other side to which the shunt resistor 40 is joined.

The shunt resistor 40 is formed in a substantially rectangular plate shape, and a plate thickness direction extends along the second width direction Z, along the axis direction X, and the first width direction Y. Then, both end portions of the shunt resistor 40 in the first width direction Y are joined and electrically connected to the joint piece portion 20i and the joint piece portion 30c by various joining means such as laser welding, electron beam welding, and brazing. With such a configuration, the shunt resistor 40 is electrically connected to the BT bus bar 20 that constitutes the battery terminal portion 2 and the GND bus bar 30 that constitutes the terminal connection portion 3.

The shunt resistor 40 includes a pair of terminal portions 40a on the end surface in the axis direction X. The pair of terminal portions 40a are output terminals that output a voltage (potential difference) generated between the end portion on the joint piece portion 20i side and the end portion of the joint piece portion 30c side of the shunt resistor 40 according to the current flowing through the shunt resistor 40 to the circuit board 8. The pair of terminal portions 40a are located on one end surface of the shunt resistor 40 in the axis direction X at intervals along the first width direction Y, and protrude from the end surface along the axis direction X to be formed in a tab shape. The shunt resistor 40 outputs a voltage (potential difference) generated at both end portions to the circuit board 8 when the pair of terminal portions 40a are electrically connected to the circuit board 8.

The housing 6 is a protective member that has an insulating property, and embeds and protects the sensor unit 4 (shunt resistor 40), the output terminal 7, the circuit board 8, and the like. The housing 6 is made of, for example, a polyphenylene sulfide (PPS) resin having an insulating property and a high heat resistance. In addition, the resin such as PPS contains glass fiber in order to increase strength of the housing 6. The housing 6 is integrally molded with the bus bar assembly BA, the stud bolt 5, the output terminal 7, etc. by, for example, insert molding, and then the circuit board 8 is assembled inside.

For example, the bus bar assembly BA is inserted (set) together with the output terminal 7 in the mold for insert molding of the housing 6, in a state in which the BT bus bar 20, the GND bus bar 30, and the shunt resistor 40 are integrated, and the stud bolt 5 is assembled in the bolt insertion hole 30b. Then, the housing 6 is formed by injecting an insulating resin into the mold and forming the housing 6 integrally with the bus bar assembly BA, the stud bolt 5, the output terminal 7, and the like.

The housing 6 exposes a portion of the bus bar assembly BA, the stud bolt 5, and the output terminal 7 to the outside in a state of embedding the bus bar assembly BA, the stud bolt 5, and the output terminal 7 therein. Specifically, the housing 6 includes a sensor cover portion 61, a bolt holding portion 62, a board cover portion 63, and a connector housing portion 64, and these are integrally formed.

Figure 7:
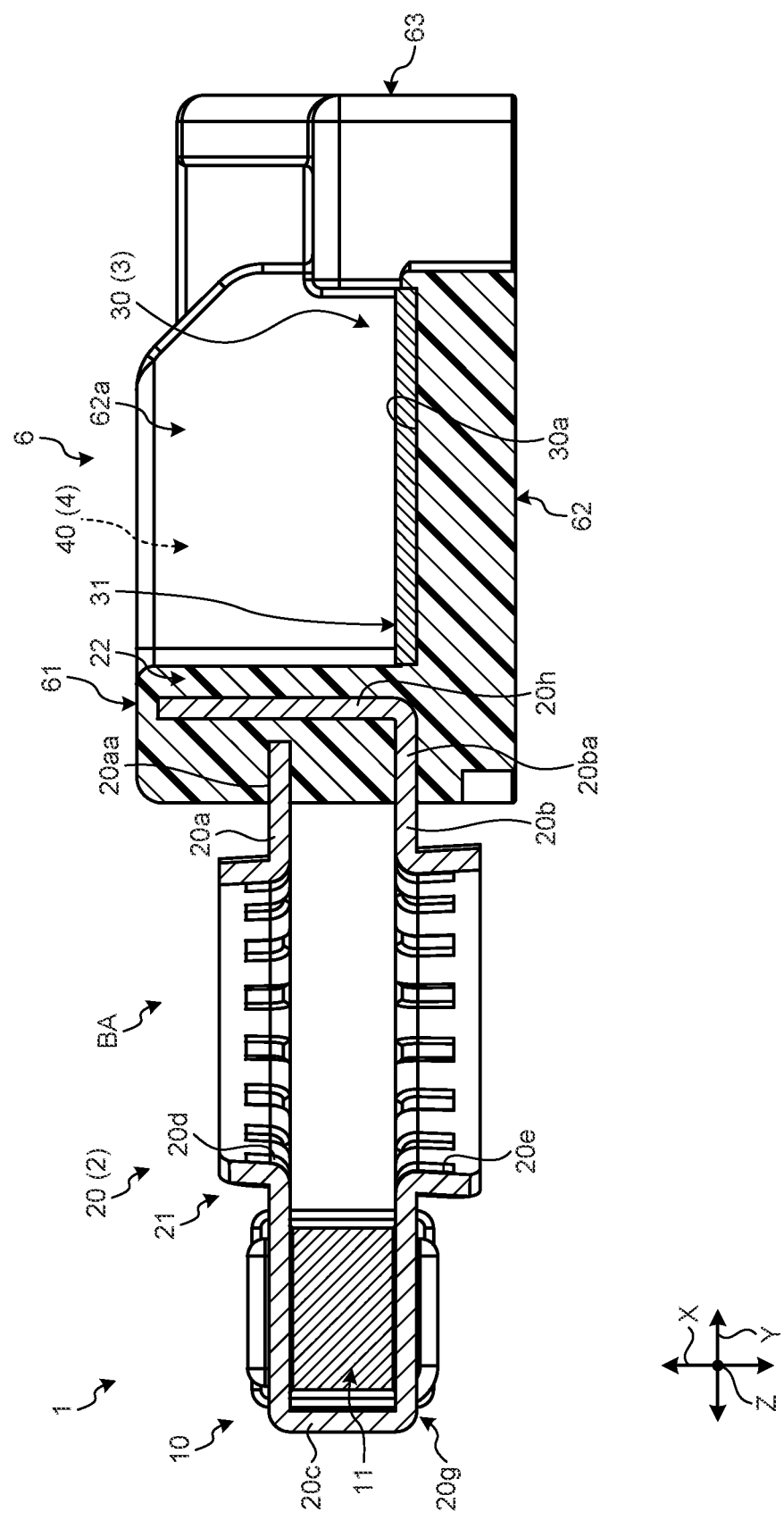
FIG. 7 is a cross-sectional view illustrating a schematic configuration of the current sensor according to the embodiment.
Figure 8:
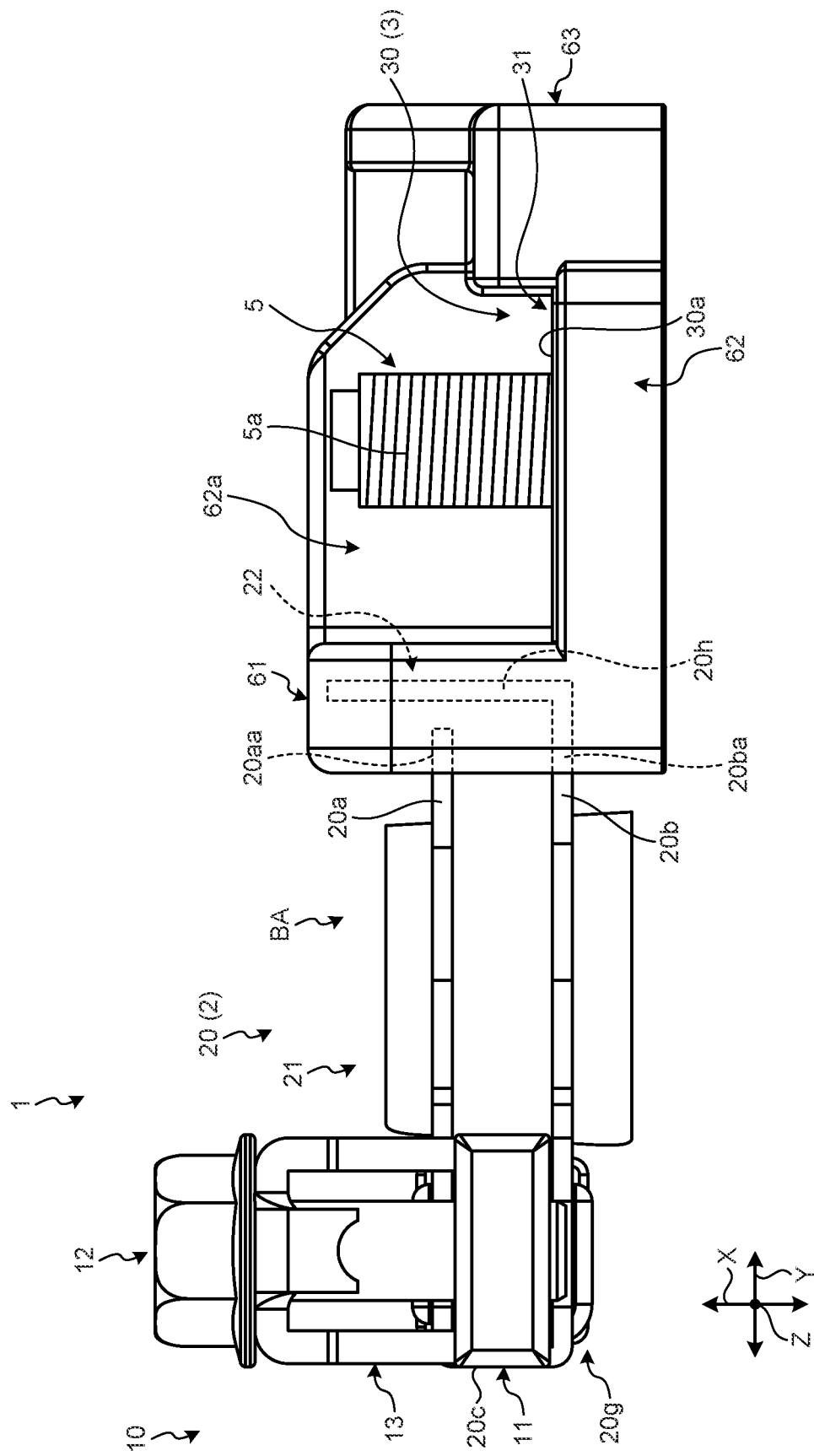
FIG. 8 is a side view illustrating a schematic configuration of the current sensor according to the embodiment.

The sensor cover portion 61 is a portion in which a shunt resistor 40 constituting the sensor unit 4 is embedded and covers and protects the shunt resistor 40. Here, the sensor cover portion 61 is embedded with the entire shunt resistor 40 of the sensor unit 4, the entire electrode portion 22 of the battery terminal portion 2, and the entire electrode portion 32 of the terminal connection portion 3 to cover and protect them. The sensor cover portion 61 is formed in a substantially L-shape when viewed along the axis direction X in accordance with a series of shapes of the electrode portion 22, the shunt resistor 40, and the electrode portion 32. As illustrated in FIGS. 7 and 8, the housing 6 exposes most of the main body portion 21 constituting the battery terminal portion 2 to the outside, and then the end portions 20aa and 20ba on the electrode portion 22 side of the plate-shaped portions 20a and 20b constituting the main body portion 21 are also embedded and integrated inside the sensor cover portion 61.

The bolt holding portion 62 is a portion in which the stud bolt 5 inserted into the bolt insertion hole 30b of the terminal connection portion 3 is embedded and held. The bolt holding portion 62 is provided at a position adjacent to the sensor cover portion 61 along the first width direction Y and at a position inside the sensor cover portion 61 formed in a substantially L-shape. The bolt holding portion 62 is formed so as to have a step with respect to the sensor cover portion 61 along the axis direction X. Here, the bolt holding portion 62 exposes one surface of the plate-shaped portion 30a of the terminal connection portion 3 and the shaft portion 5a of the stud bolt 5 along one side in the axis direction X, and the plate-shaped portion 30a and the base portion 5b of the stud bolt 5 are embedded in the bolt holding portion 62 to be covered and protected. The bolt holding portion 62 is formed in a substantially rectangular shape when viewed along the axis direction X in accordance with the shapes of the plate-shaped portion 30a and the base portion 5b of the stud bolt 5. One surface of the plate-shaped portion 30a and the shaft portion 5a of the stud bolt 5 exposed from the bolt holding portion 62 are exposed to a space portion 62a surrounded by the sensor cover portion 61 and the bolt holding portion 62. The space portion 62a is formed according to the step between the sensor cover portion 61 and the bolt holding portion 62, and the connection terminal T and the nut 5c to be assembled to the shaft portion 5a of the stud bolt 5 are located.

The board cover portion 63 is a portion that accommodates the circuit board 8 inside and covers and protects the circuit board 8. The board cover portion 63 is located at a position adjacent to the sensor cover portion 61 along the first width direction Y and the second width direction Z, and is provided at a position opposite to the bolt holding portion 62 with the sensor cover portion 61 interposed therebetween in the second width direction Z. The board cover portion 63 is formed so as to have a step with respect to the sensor cover portion 61 along the axis direction X, similarly to the bolt holding portion 62. The board cover portion 63 is formed in a substantially rectangular shape when viewed along the axis direction X in accordance with the shape of the circuit board 8 formed in the substantially rectangular plate shape.

Figure 9:
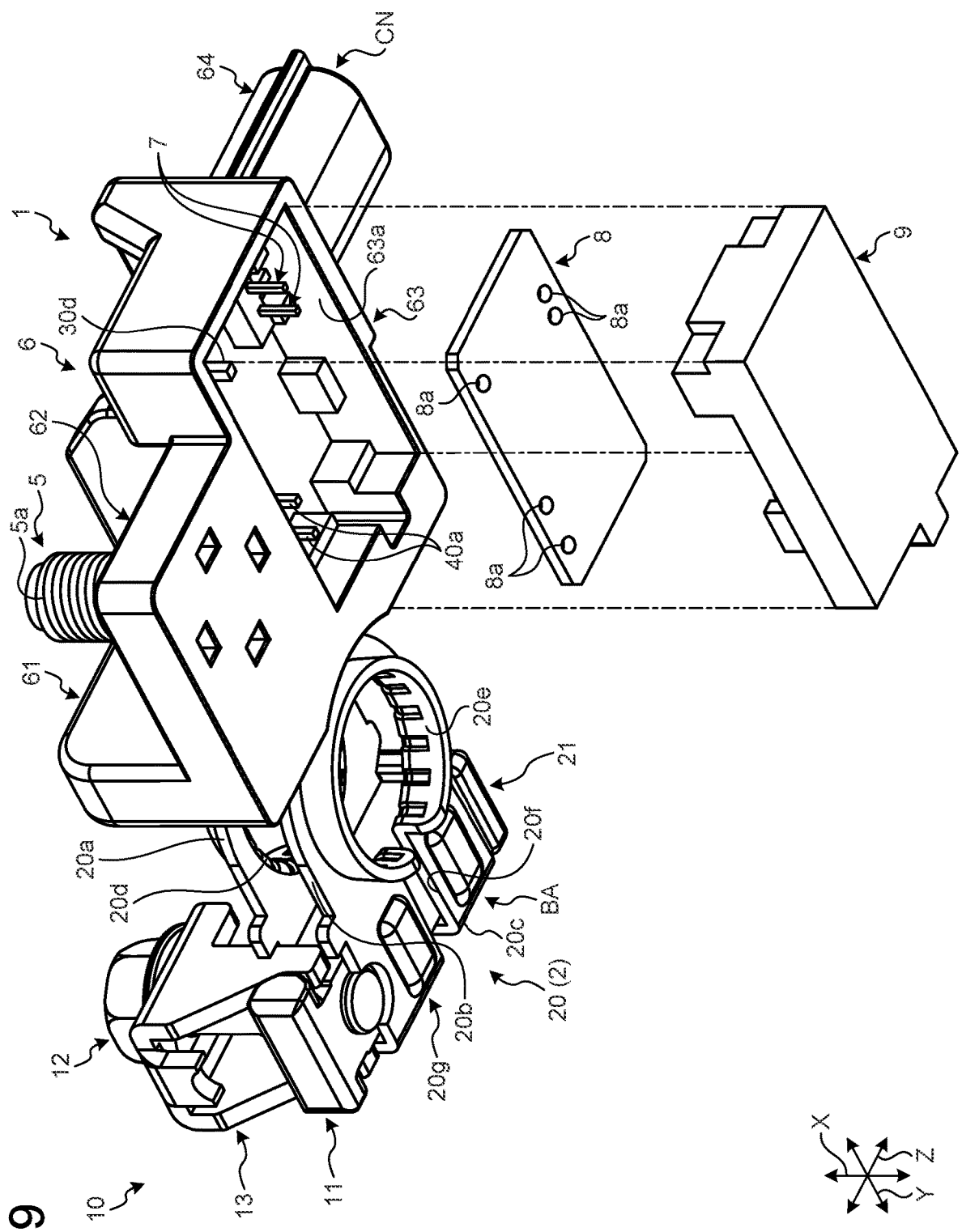
FIG. 9 is an exploded perspective view illustrating a schematic configuration of the current sensor according to the embodiment.

As illustrated in FIG. 9, the board cover portion 63 is formed with an installation opening 63a for assembling the circuit board 8 inside the board cover portion 63 after the housing 6 is molded. The installation opening 63a is formed as a space portion of a substantially rectangular shape according to the shape of the circuit board 8, and is opened toward one side in the axis direction X (the side opposite to the side on which the shaft portion 5a of the stud bolt 5 protrudes). In the installation opening 63a, the ground terminal portion 30d of the terminal connection portion 3, the terminal portion 40a of the shunt resistor 40, and the end portion of the output terminal 7 are exposed. The installation opening 63a is sealed by the mold material 9 after the circuit board 8 is assembled inside the board cover portion 63.

The connector housing portion 64 is a portion that constitutes a connector portion CN together with the output terminal 7. The connector housing portion 64 is formed so as to protrude from the board cover portion 63 to one side (opposite to the bolt holding portion 62 side) along the second width direction Z. The connector housing portion 64 is formed in a tubular shape that opens on one side in the second width direction Z, and holds the output terminal 7 so as to expose the end portion of the output terminal 7 inside.

The output terminal 7 is a terminal that is electrically connected to the circuit board 8 and outputs a sensor output detected by the sensor unit 4 to the outside. Here, the output terminal 7 has conductivity and is configured by a pair of bent terminals formed in a substantially L-shape. As described above, the output terminal 7 is embedded and integrated inside the connector housing portion 64 by insert molding. With the output terminal 7 embedded in the connector housing portion 64, one end portion thereof is exposed in the connector housing portion 64 along the second width direction Z, and the other end portion is exposed in the above-mentioned installation opening 63a along the axis direction X. The connector portion CN configured by the connector housing portion 64 and the output terminal 7 is electrically connected to a mating connector by fitting the connector to the mating connector, and electrically connects an output destination of the sensor output, for example, a higher-level ECU in the vehicle V and the circuit board 8.

The circuit board 8 is a board on which electronic components are mounted to constitute an electronic circuit. The circuit board 8 is electrically connected to the shunt resistor 40, and electronic components that realize various functions such as the above-mentioned amplifier AP (see FIG. 1) are mounted. The circuit board 8 is configured by, for example, a so-called printed circuit board (PCB). On the circuit board 8, a circuit body is configured by a wiring pattern by printing the wiring pattern (printed pattern) on an insulating layer made of an insulating material such as epoxy resin, glass epoxy resin, paper epoxy resin or ceramic by using a conductive material such as copper. The circuit board 8 is formed in a substantially rectangular plate shape, and has a plate thickness direction extending along the axis direction X, the first width direction Y, and the second width direction Z, in a state of being accommodated inside the board cover portion 63.

The circuit board 8 has a plurality of through holes 8a penetrating along the axis direction X. As illustrated in FIG. 9, the circuit board 8 is assembled in the board cover portion 63 via the installation opening 63a described above. In this case, in the circuit board 8, the ground terminal portion 30d of the terminal connection portion 3, the terminal portion 40a of the shunt resistor 40, the output terminal 7, and the like are inserted into the plurality of through holes 8a along the axis direction X, and are assembled in the board cover portion 63. The circuit board 8 configures an electronic circuit that electrically connects the ground terminal portion 30d of the terminal connection portion 3, the terminal portion 40a of the shunt resistor 40, the output terminal 7, and the like, inserted through the through holes 8a by soldering them to the circuit body. Then, the installation opening 63a is sealed by the mold material 9 by being filled with the mold material 9 after the circuit board 8 is assembled inside the board cover portion 63. The mold material 9 is typically made of a resin material that is softer than the resin material that constitutes the housing 6. The mold material 9 is made of, for example, a urethane resin having an insulating property and a high adhesiveness.

The voltage (potential difference) generated at both end portions of the shunt resistor 40 is input to the circuit board 8 via the pair of terminal portions 40a connected as described above. The circuit board 8 may amplify the input voltage (detection voltage) by the amplifier AP and output the amplified detection voltage itself to the higher-level ECU via the output terminal 7 (analog output). In this case, the higher-level ECU calculates the current value based on the input detection voltage. Or, on the circuit board 8, a microcomputer may be mounted as an electronic component, a current value may be calculated by the microcomputer based on the detection voltage amplified by the amplifier AP, and a detection signal representing the calculated current value may be output to the higher-level ECU via the output terminal 7 (digital output).

Figure 6:
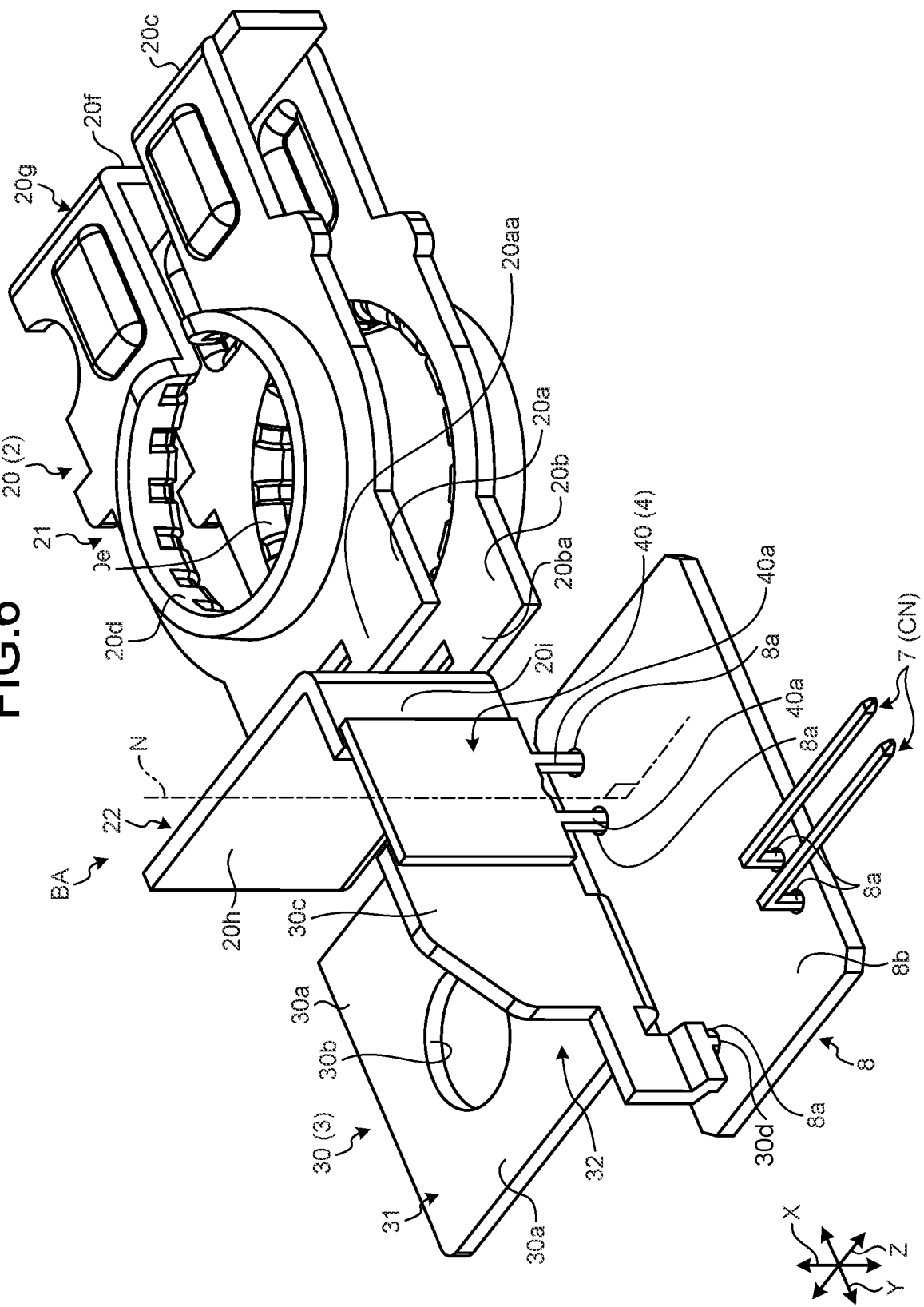
FIG. 6 is an exploded perspective view illustrating a schematic configuration of a bus bar assembly of the current sensor according to the embodiment.

Then, in the state where the circuit board 8 configured as described above is accommodated inside the board cover portion 63, as illustrated in FIG. 6 and the like, the above-mentioned shunt resistor 40 is erected on a main surface 8b so that the normal N of the main surface 8b on one side of the axis direction X is along the axis direction X and along the normal direction (here, the axis direction X).

That is, the shunt resistor 40 of the present embodiment is erected on the main surface 8b of the circuit board 8. Here, the shunt resistor 40 is typically erected with respect to the main surface 8b at an angle such that the terminal portion 40a can be inserted linearly along the axis direction X with respect to the through hole 8a. More specifically, the shunt resistor 40 of the present embodiment is erected on the main surface 8b so as to intersect the main surface 8b of the circuit board 8 perpendicularly. In other words, the shunt resistor 40 extends along the normal direction (here, the axis direction X) along the normal N of the main surface 8b of the circuit board 8. Here, when the shunt resistor 40 is erected on the main surface 8b so as to intersect the main surface 8b perpendicularly, strictly speaking, for example, within the range of tolerance, some error is allowed. In addition, here, the shunt resistor 40 is erected on the main surface 8b of the circuit board 8 at one end portion (the end portion on the terminal connection portion 3 side) in the second width direction Z.

The current sensor 1 configured as described above is fastened to the battery post P by tightening the tightening end portion 20g by the tightening mechanism 10 in a state where the battery post P is inserted into the post insertion holes 20d and 20e of the battery terminal portion 2. The tightening mechanism 10 is a mechanism for fastening the battery terminal portion 2 to the battery post P by tightening the tightening end portion 20g of the battery terminal portion 2 along the second width direction Z. Here, as an example, the tightening mechanism 10 includes a plate nut 11 as a penetrating member, a fastening bolt 12 as a fastening member, and a bracket 13 as a pressing force conversion member, which work together to generate a force that tightens the tightening end portion 20g along the second width direction Z. The tightening mechanism 10 is attached to the tightening end portion 20g with the plate nut 11 being inserted into the tightening end portion 20g in a positional relationship so as to cross the slit 20f along the second width direction Z, and the fastening bolt 12 and the bracket 13 being assembled to the plate nut 11.

Although a detailed description is omitted, when the battery terminal portion 2 is fastened to the battery post P, the tightening mechanism 10 tightens the fastening bolt 12 along the axis direction X with the battery post P inserted into the post insertion holes 20d and 20e. As a result, the tightening mechanism 10 generates a tightening force along the axis direction X between the fastening bolt 12 and the plate nut 11. Then, the tightening mechanism 10 converts the generated tightening force into a pressing force along the second width direction Z by an action of the plate nut 11 and the bracket 13. Then, the tightening mechanism 10 tightens the tightening end portion 20g via the plate nut 11 and the bracket 13 by the converted pressing force so as to narrow a width of the slit 20f along the second width direction Z. As a result, the tightening mechanism 10 can reduce the diameters of the post insertion holes 20d and 20e, and fasten the battery terminal portion 2 to the battery post P to conduct conduction. Note that the tightening mechanism 10 is not limited to the above type, may include, for example, bolts and nuts, and may be of a type in which the tightening end portion 20g is tightened along the second width direction Z by tightening the bolt along the second width direction Z.

Then, in the current sensor 1, the connection terminal T is fastened to the shaft portion 5a, and the connection terminal T and the fastening portion 31 of the terminal connection portion 3 are electrically connected, by assembling the connection terminal T to the shaft portion 5a of the stud bolt 5 and screwing the nut 5c.

In this state, the current sensor 1 detects the current flowing between the connection terminal T and the battery post P by the sensor unit 4, and outputs the detected sensor output to the higher-level ECU via the connector portion CN. That is, the current sensor 1 amplifies and outputs a voltage (detection voltage) generated across the shunt resistor 40 according to the current flowing through the shunt resistor 40 by the amplifier AP, and detects the current flowing through the shunt resistor 40 based on the output of the amplifier AP. In this case, the main body that actually calculates the current value may be a microcomputer mounted on the circuit board 8 or a higher-level ECU that is the output destination of the sensor output.

Then, the current sensor 1 of the present embodiment can suppress the influence of the heat generated by the shunt resistor 40 on the circuit board 8 when detecting the current by the shunt resistor 40 being erected on the main surface 8b so as to intersect the main surface 8b of the circuit board 8 perpendicularly as described above.

In such a current sensor 1, most of the heat generated by the shunt resistor 40 is dissipated through the BT bus bar 20 and the GND bus bar 30, which have higher thermal conductivity than the housing 6. On the other hand, a part of the heat that is not dissipated through the BT bus bar 20 and the GND bus bar 30 of the heat generated by the shunt resistor 40 is transferred to the circuit board 8 side via the terminal portion 40a and the like, but by mounting an electronic component having low heat resistance on the circuit board 8 at a position away from the terminal portion 40a, the current sensor 1 can suppress the influence of heat and reduce a temperature rise of the electronic component.

In this case, in the current sensor 1, since the shunt resistor 40 and the circuit board 8 are arranged so as not to face each other and confront each other along the normal direction of the main surface 8b, the heat generated by the shunt resistor 40 can be prevented from being trapped in the space between the shunt resistor 40 and the main surface 8b. As a result, the current sensor 1 can secure good heat dissipation and reduce the heat transferred from the shunt resistor 40 side to the circuit board 8 side.

In addition, in the current sensor 1, the shunt resistor 40 and the circuit board 8 are arranged in the above positional relationship, so that the shunt resistor 40, which is a heat source, and the circuit board 8 can be disposed so as to be relatively separated from each other. In this respect as well, the current sensor 1 can reduce the heat transferred from the shunt resistor 40 side to the circuit board 8 side.

In addition, in the current sensor 1, the shunt resistor 40 and the circuit board 8 are arranged in the above positional relationship, so that an air layer (outside air) can be adjacent to the sensor cover portion 61 of the housing 6 that covers the shunt resistor 40. Then, the current sensor 1 ensures good heat dissipation by allowing the heat of the shunt resistor 40 to be dissipated and cooled through the sensor cover portion 61 by the outside air convected in the air layer adjacent to the sensor cover portion 61. In this respect as well, the current sensor 1 can reduce the heat transferred from the shunt resistor 40 side to the circuit board 8 side.

Figure 10:
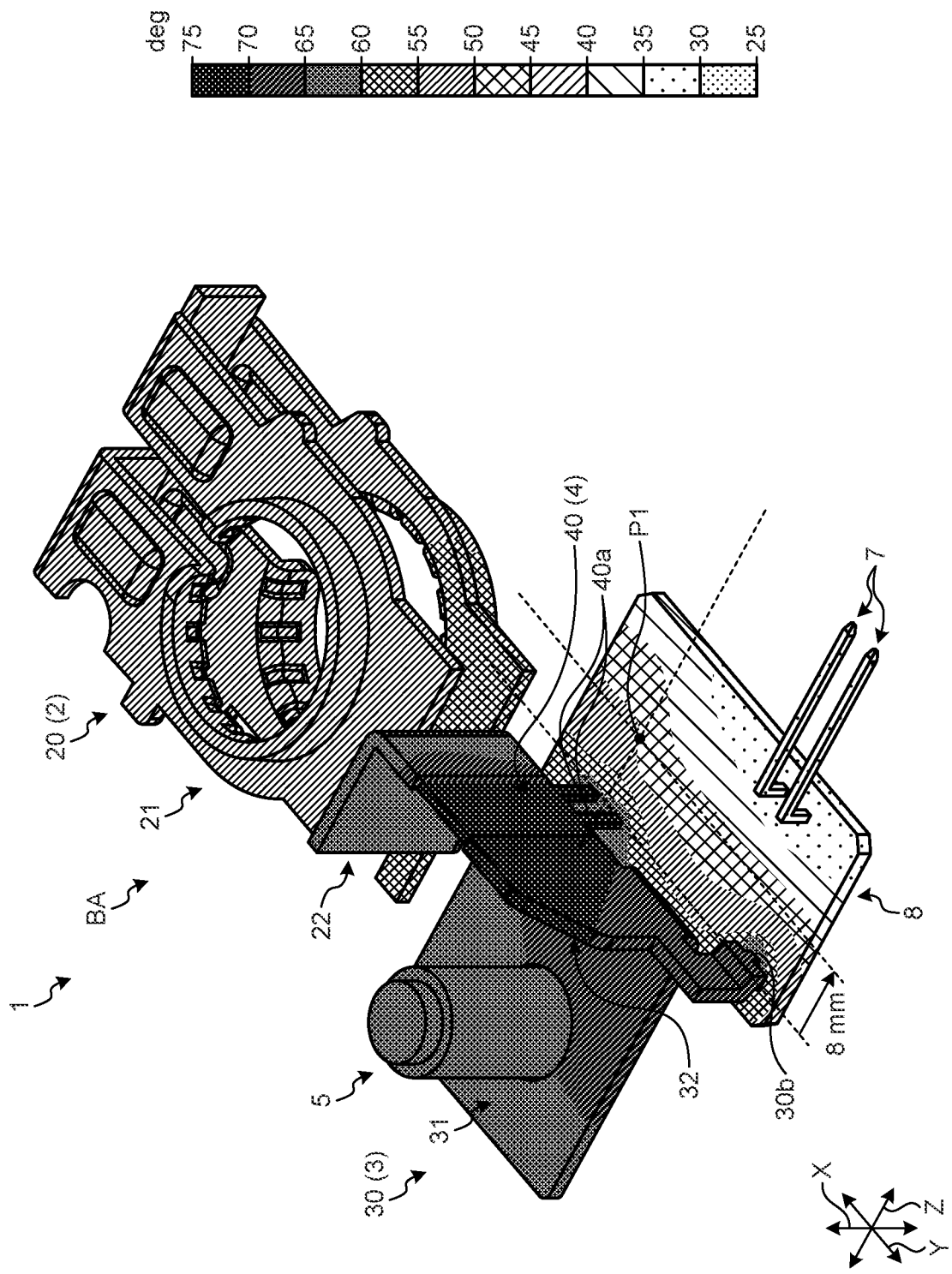
FIG. 10 is a schematic diagram illustrating an example of a simulation result of the current sensor according to the embodiment.
Figure 11:
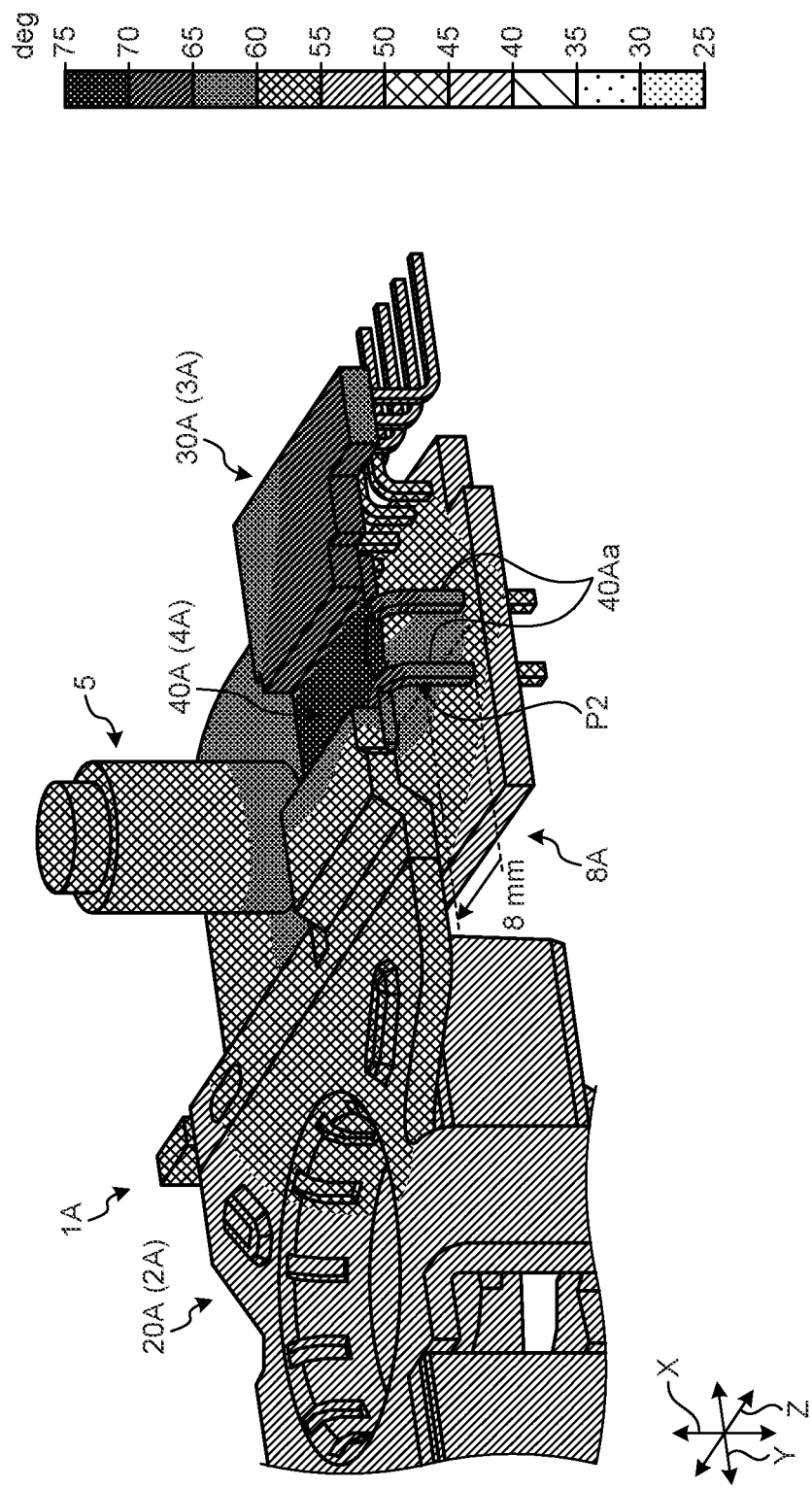
FIG. 11 is a schematic diagram illustrating an example of a simulation result of a current sensor according to a comparative example.

FIG. 10 is a schematic diagram illustrating an example of a simulation result of the current sensor 1 according to the present embodiment. On the other hand, FIG. 11 is a schematic diagram illustrating an example of a simulation result of a current sensor 1A according to a comparative example. The current sensor 1A according to the comparative example differs from the current sensor 1 of the present embodiment in that a shunt resistor 40A of a sensor unit 4A which is electrically connected across a BT bus bar 20A constituting a battery terminal portion 2A and a GND bus bar 30A constituting the terminal connection portion 3A is arranged so as to face the circuit board 8A along the axis direction X and confront each other in parallel. Other configurations of the current sensor 1A according to the comparative example are substantially the same as those of the current sensor 1 of the present embodiment, although there are some differences in shape.

The simulation results illustrated in FIGS. 10 and 11 show the results of thermal analysis when a current of 100 A is continuously applied to the shunt resistors 40 and 40A of the current sensors 1 and 1A, respectively. In this thermal analysis, the housing 6 and the like are also provided, but in FIGS. 10 and 11, the housing 6 and the like are not illustrated.

As is clear from FIG. 11, in the current sensor 1A according to the comparative example, the shunt resistor 40A is arranged to face and confront the circuit board 8A along the axis direction X, so that it is clear that the heat generated by the shunt resistor 40A tends to be trapped in a space between the shunt resistor 40A and the circuit board 8A. In addition, in the current sensor 1A according to the comparative example, the shunt resistor 40 and the circuit board 8A are arranged in the above positional relationship, so that it is clear that heat tends to be easily transferred from the shunt resistor 40A side to the circuit board 8A side because the range in which the shunt resistor 40A, which is a heat source, and the circuit board 8A are close to each other is relatively wide.

On the other hand, as is clear from FIG. 10, in the current sensor 1 according to the present embodiment as compared with the current sensor 1A according to the comparative example, it is clear that the heat generated by the shunt resistor 40 is unlikely to be trapped in the space between the shunt resistor 40 and the main surface 8b, and the heat transferred from the shunt resistor 40 side to the circuit board 8 side can be reduced.

Figure 12:
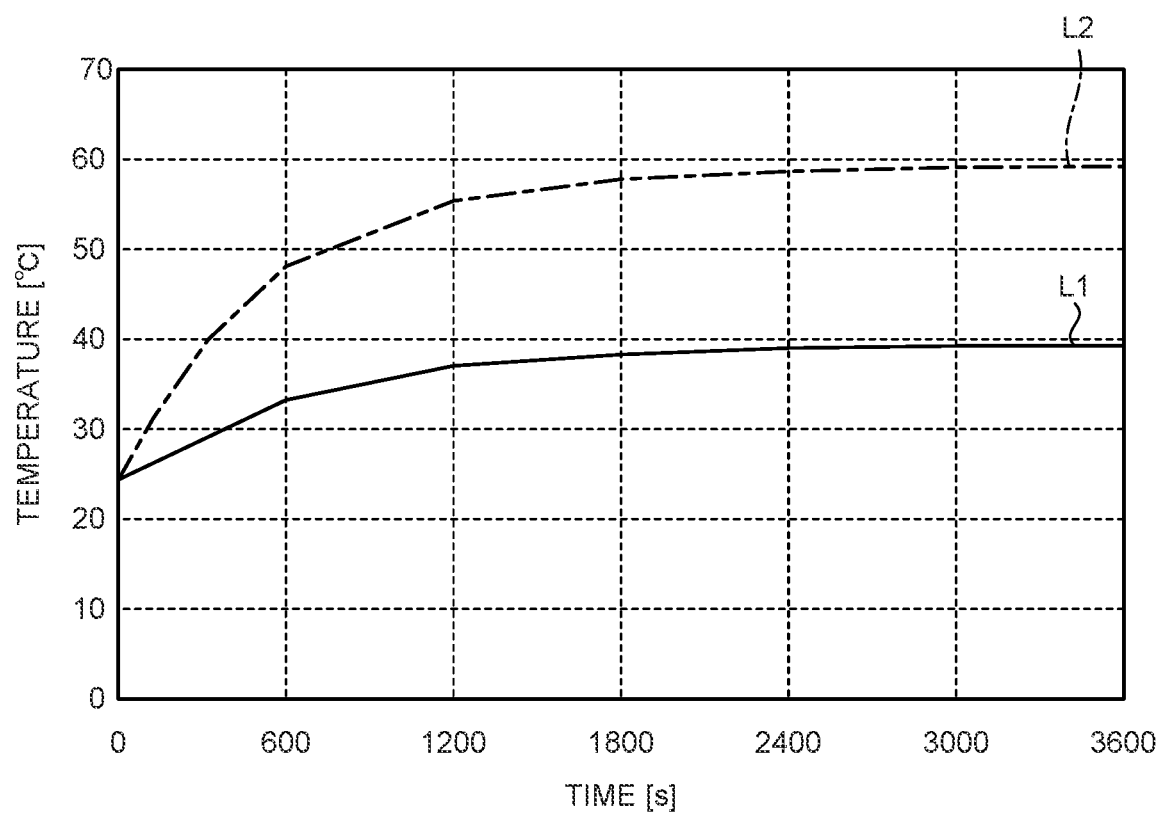
FIG. 12 is a diagram illustrating an example of a simulation result of the current sensor according to the embodiment.

FIG. 12 is a diagram comparing the tendency of the temperature rise at a predetermined point of the current sensors 1 and 1A. FIG. 12 illustrates a temperature comparison at points P1 and P2 of the circuit boards 8 and 8A separated from a center position between a pair of terminal portions 40a and 40Aa of the shunt resistors 40 and 40A by 8 mm along the second width direction Z. In FIG. 12, a horizontal axis is an elapsed time and a vertical axis is a temperature. In FIG. 12, a line L1 represents the temperature of the point P1 on the circuit board 8 of the current sensor 1, and the line L2 represents the temperature of the point P2 on the circuit board 8A of the current sensor 1A. Here, the lines L1 and L2 represent the temperature rise from 25° C. at each point P1 and P2 when 100 A is energized.

As is clear from FIG. 12, in the current sensor 1A according to the comparative example, a maximum temperature at the point P2 is 58° C. ($\Delta T=+33°$ C.), whereas in the current sensor 1 according to the present embodiment, it is clear that a maximum temperature at the point P1 is 40° C. ($\Delta T=+15°$ C.), and the influence of heat generated by the shunt resistor 40 is suppressed.

The current sensor 1 described above detects the current by the shunt resistor 40 electrically connected to the battery terminal portion 2 fastened to the battery post P. In this configuration, since the current sensor 1 can be arranged so that the shunt resistor 40 and the circuit board 8 do not face each other and do not confront each other, the influence of heat generated by the shunt resistor 40 can be suppressed as described above. As a result, the current sensor 1 can ensure appropriate heat resistance performance even when an electronic component having a relatively low heat resistance is used as the electronic component mounted on the circuit board 8, for example. In addition, the current sensor 1 can raise an upper limit value of the current capable of continuously energizing, for example.

Here, in the current sensor 1 described above, the shunt resistor 40 extends along the normal direction of the main surface 8b of the circuit board 8 and intersects the main surface 8b of the circuit board 8 perpendicularly. With this configuration, since the current sensor 1 can be arranged so that the shunt resistor 40, which is the heat source, and the circuit board 8 are separated as much as possible, the influence of heat generated by the shunt resistor 40 can be suppressed more preferably.

In addition, in the current sensor 1 described above, as illustrated in FIGS. 2, 3, 4, 5, and the like, the housing 6 has a lightening portion 61a, so that the heat dissipation can be further improved. The lightening portion 61a is a space portion formed in a concave shape in the sensor cover portion 61 of the housing 6, and is formed here at a position adjacent to the shunt resistor 40 along the second width direction Z. With this configuration, the current sensor 1 can make the lightening portion 61a function as an air layer adjacent to the sensor cover portion 61 covering the shunt resistor 40, and can dissipate heat from the shunt resistor 40 through the sensor cover portion 61 and cool the heat by the outside air convected in the lightening portion 61a. As a result, the current sensor 1 can secure even better heat dissipation, and can more preferably suppress the influence of heat generated by the shunt resistor 40.

Note that the current sensor according to the embodiment of the present invention described above is not limited to the embodiment described above, and various modifications can be made within the scope described in the claims.

In the above description, it has been described that the battery terminal portion 2 is formed by integrally forming the pair of plate-shaped portions 20a and 20b and the bending connection portion 20c by press bending of a conductive metal plate or the like, but is not limited thereto. For example, the battery terminal portion 2 does not have the bending connection portion 20c, but has the pair of plate-shaped portions 20a and 20b formed separately from each other and has a two-layer split structure, and may have a configuration in which the pair of plate-shaped portions 20a and 20b that are separately formed are integrated.

In the above description, the shunt resistor 40 has been described as being arranged so as to extend along the normal direction of the main surface 8b of the circuit board 8 and intersect the main surface 8b of the circuit board 8 perpendicularly, but is not limited thereto, and may be erected on the main surface 8b of the circuit board 8.

In the above description, the battery terminal portion 2 has been described as having the main body portion 21 and the electrode portion 22 integrally formed, but is not limited thereto. The battery terminal portion 2 may have a configuration in which the main body portion 21 and the electrode portion 22 have a separate structure, and the main body portion 21 and the electrode portion 22 are electrically connected by bolting or the like. In this case, in the current sensor 1, for example, the main body portion 21 of the battery terminal portion 2 and the other portions are configured as separate bodies, and as described above, the main body portion 21 and the electrode portion 22 may be electrically connected by bolting or the like to form an assembly as a whole.

Figure 13:
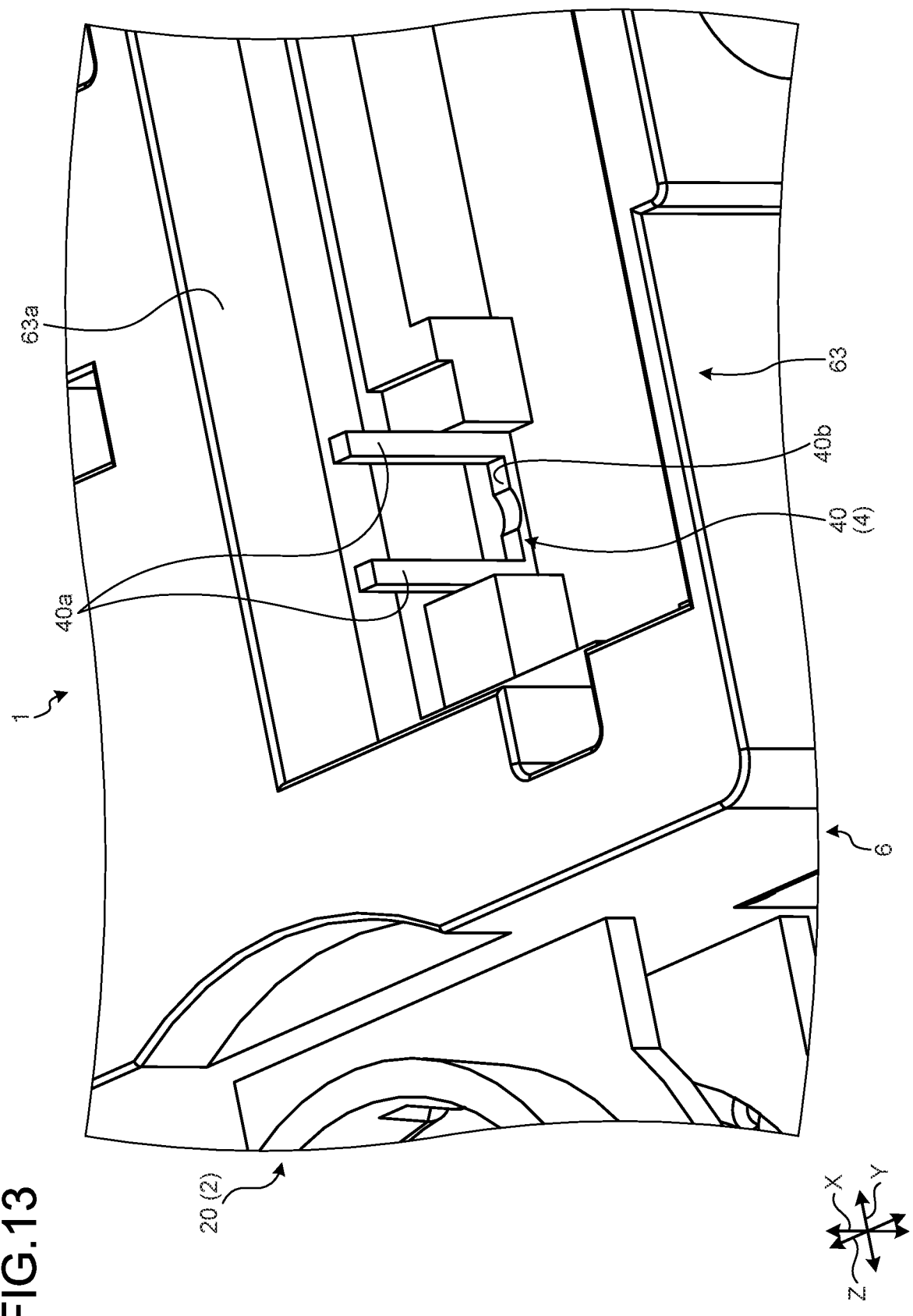
FIG. 13 is a partial perspective view illustrating a schematic configuration of a current sensor according to a modified example.

Not that in the above description, the installation opening 63a has been described as exposing the terminal portion 40a of the shunt resistor 40 and the like, but in addition to this, as illustrated in FIG. 13, the end portion 40b of the main body portion (measurement category) of the shunt resistor 40 may also be configured to be exposed from the housing 6. Note that here, FIG. 13 does not illustrate the circuit board 8 and the mold material 9.

The end portion 40b of the shunt resistor 40 is a portion located at the terminal in the axis direction X of the main body portion between the pair of terminal portions 40a. The end portion 40b of the shunt resistor 40 illustrated in FIG. 13 partially protrudes from the housing 6 into the installation opening 63a, and is not completely covered (sealed) by the housing 6.

Note that in the final form of the current sensor 1, the end portion 40b of the shunt resistor 40 is not exposed to the outside because it is covered with the mold material 9 together with the terminal portion 40a and the like. In this case, in a state where the end portion 40b of the shunt resistor 40 is exposed from the housing 6 to the installation opening 63a side as described above, the current sensor 1 can relieve the stress applied to the terminal portion 40a by filling the installation opening 63a with the mold material (potting material) 9 softer than the housing 6. In addition, in the current sensor 1, by covering these portions with the mold material (potting material) 9 as described above, the stress applied to the terminal portion 40a during thermal expansion and contraction can be suppressed, and the life of the terminal portion 40a and the solder (connection portion of the circuit board 8 board, etc.) can be extended.

As a result, the current sensor 1 can improve the durability while ensuring the appropriate heat resistance performance as described above.

In addition, in the current sensor 1, a temperature sensor for estimating a battery temperature of the battery B may be arranged on the circuit board 8 in order to detect a state of the battery B. Since the current sensor 1 has a temperature distribution on the circuit board 8 when energized, the accuracy of battery temperature detection can be improved by mounting the temperature sensor at a position where the temperature of the battery terminal portion 2 closer to the battery B and the temperature on the circuit board 8 substantially match. In this case, for example, a thermistor, a temperature IC, or the like can be used as the temperature sensor. Note that in each of the above drawings, various electronic components mounted on the circuit board 8 such as the amplifier AP, the microcomputer, the temperature sensor, and the capacitor are not illustrated.

In the current sensor according to the present embodiment, the shunt resistor and the circuit board can be arranged so as not to face each other and not confront each other, the influence of heat generated by the shunt resistor can be suppressed.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A current sensor comprising:
a battery terminal portion that is conductive and is fastened to a battery post;
a shunt resistor for current detection, which is formed in a plate shape and is electrically connected to the battery terminal portion; and
a circuit board that is formed in a plate shape and is electrically connected to the shunt resistor, wherein
the shunt resistor includes,
a pair of terminals that pass through a main surface of the circuit board in a first direction, and
a main body that extends from the terminals in the first direction and protrudes from the main surface of the circuit board in the first direction such that the shunt resistor is erected on the main surface of the circuit board.

2. The current sensor according to claim 1, wherein the first direction is a normal direction of the main surface of the circuit board.

3. The current sensor according to claim 2, wherein the shunt resistor intersects the main surface of the circuit board perpendicularly.

4. The current sensor according to claim 3, further comprising:
a housing that has an insulating property and embeds the shunt resistor and the circuit board, wherein
the housing has a lightening portion formed in a concave shape.

5. The current sensor according to claim 2, further comprising:
a housing that has an insulating property and embeds the shunt resistor and the circuit board, wherein
the housing has a lightening portion formed in a concave shape.

6. The current sensor according to claim 1, wherein the shunt resistor intersects the main surface of the circuit board perpendicularly.

7. The current sensor according to claim 6, further comprising:
a housing that has an insulating property and embeds the shunt resistor and the circuit board, wherein the housing has a lightening portion formed in a concave shape.

8. The current sensor according to claim 1, further comprising:
a housing that has an insulating property and embeds the shunt resistor and the circuit board such that the shunt resistor is contained entirely within the housing, wherein
the housing has a lightening portion formed in a concave shape.

9. A current sensor comprising:
a battery terminal portion that is conductive and is fastened to a battery post;
a shunt resistor for current detection, which is formed in a plate shape and is electrically connected to the battery terminal portion; and
a circuit board that is formed in a plate shape and is electrically connected to the shunt resistor, wherein
the shunt resistor includes,
a pair of terminals that pass through a main surface of the circuit board, and
a main body that is formed as a rectangular plate, the main body extends from the terminals and protrudes from the main surface of the circuit board in a direction that intersects the main surface of the circuit board perpendicularly.

10. The current sensor according to claim 9, further comprising:
a housing that has an insulating property and embeds the shunt resistor and the circuit board, wherein
the housing has a lightening portion formed in a concave shape.

* * * * *